United States Patent [19]

Darrow et al.

[11] 4,434,134

[45] Feb. 28, 1984

[54] PINNED CERAMIC SUBSTRATE

[75] Inventors: Russell E. Darrow, Endicott; Joseph Funari, Vestal; George S. Kotrch, Endicott; George C. Phillips, Endwell, all of N.Y.

[73] Assignee: International Business Machines Corporation, Armonk, N.Y.

[21] Appl. No.: 252,748

[22] Filed: Apr. 10, 1981

[51] Int. Cl.³ .............................................. B22F 3/00
[52] U.S. Cl. ........................................ 419/5; 419/36;
419/40; 29/842; 29/844; 29/852; 29/845;
29/853; 29/875; 29/884
[58] Field of Search ................ 419/5, 36, 40; 29/842,
29/844, 852, 845, 853, 875, 884

[56] References Cited

U.S. PATENT DOCUMENTS

| | | |
|---|---|---|
| 349,572 | 9/1986 | Dick . |
| 786,257 | 4/1905 | Beebe . |
| 930,723 | 8/1909 | Von Bolton et al. . |
| 936,403 | 10/1909 | Von Bolton et al. . |
| 1,701,342 | 2/1929 | Skaupy . |
| 2,412,925 | 12/1946 | Stupakoff ............................. 49/77 |
| 2,464,437 | 3/1949 | Dasher ............................. 29/191.2 |
| 3,049,795 | 8/1962 | Valyi ............................. 29/182.3 |
| 3,201,858 | 8/1965 | Valyi ............................. 29/157.3 |
| 3,216,097 | 11/1965 | Stricker et al. ...................... 29/203 |
| 3,257,708 | 6/1966 | Stricker ............................. 29/155.55 |
| 3,372,474 | 3/1968 | Polley et al. ........................ 29/853 |
| 3,374,110 | 3/1968 | Miller ............................... 117/212 |
| 3,518,756 | 7/1970 | Bennett et al. ...................... 29/625 |
| 3,539,876 | 11/1970 | Feinberg et al. .................... 317/101 |
| 3,540,894 | 11/1970 | McIntosh ............................ 106/39 |
| 3,561,110 | 2/1971 | Feulner et al. ...................... 29/602 |
| 3,735,466 | 5/1973 | Jensen ............................. 29/203 B |
| 3,736,651 | 6/1973 | Law et al. ........................... 29/428 |
| 3,768,134 | 10/1973 | Reda et al. ......................... 29/203 B |
| 3,846,823 | 11/1974 | Matthews et al. .................... 357/74 |
| 4,024,629 | 5/1977 | Lemoine ............................ 29/625 |
| 4,050,756 | 9/1977 | Moore .............................. 29/845 |
| 4,067,104 | 1/1978 | Tracy .............................. 29/626 |
| 4,082,394 | 4/1978 | Gedney et al. .................. 339/17 M |
| 4,092,697 | 5/1978 | Spaight ............................ 361/386 |

OTHER PUBLICATIONS

"Pinning Technique for Ceramic Module", J. R. Lynch, IBM Technical Disclosure Bulletin, vol. 14, No. 1, Jun. 1971, pp. 174–175.

"Low-Stress Pin Insertion", R. J. Modlo et al., IBM Technical Disclosure Bulletin, vol. 2, No. 8B, Jan. 1980, pp. 3649–3650.

*Primary Examiner*—Brooks H. Hunt
*Attorney, Agent, or Firm*—Norman R. Bardales

[57] ABSTRACT

Ceramic substrates are pinned using powdered metallurgy pins formed in situ on the substrate.

7 Claims, 9 Drawing Figures

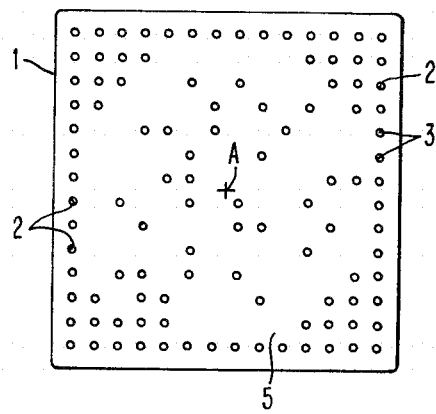
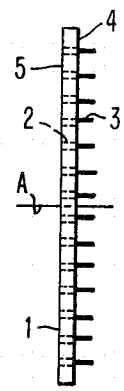
FIG. 1
FIG. 2
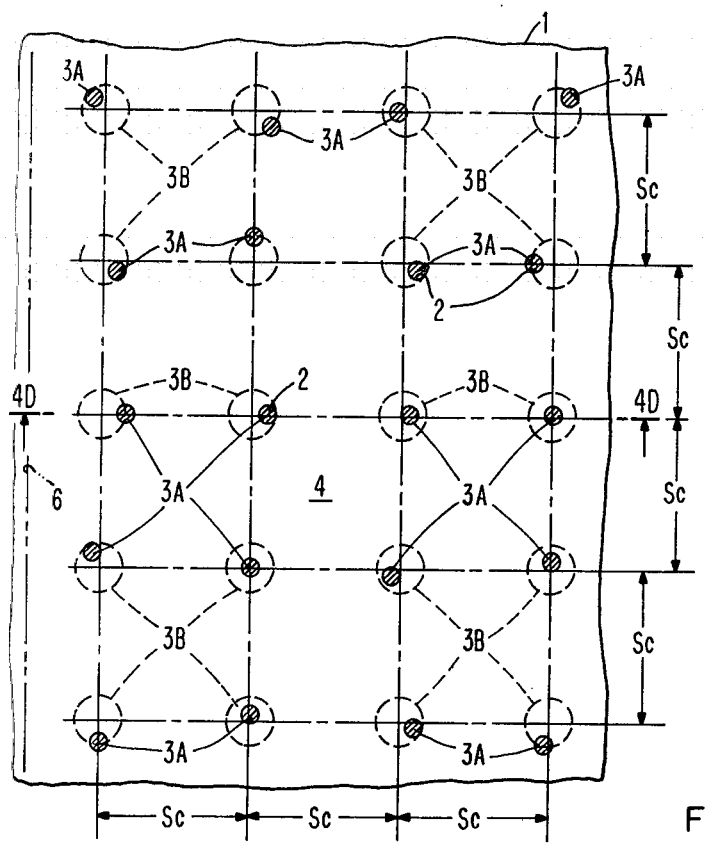
FIG. 5

PINNED CERAMIC SUBSTRATE

CROSS-REFERENCE TO OTHER APPLICATIONS

In co-pending patent application, Ser. No. 223,190, filed Jan. 7, 1981, now abandoned, and in the continuation application, Ser. No. 458,375, filed Jan. 17, 1983 of the aforementioned now abandoned parent application, Ser. No. 223,190, entitled "Pinned Substrate Apparatus", D. E. Houser, and assigned to the common assignee herein, and in co-pending patent application, Ser. No. 223,191, filed concurrently therewith, entitled "Impact Pinner", D. E. Houser et al, and also assigned to the common assignee herein, there are described ceramic substrates that are pinned by impacting the pin(s) with a force that places the pin in a temporary viscoelastic fluid state. That causes the part of the pin located in the ceramic substrate hole to be in an interlocking engaged relationship with the ceramic particles of the substrate surrounding the hole when the pin returns to its undisturbed condition, i.e. its solid state.

BACKGROUND OF THE INVENTION

1. Field of the Invention

This invention relates to pinned substrates and more particularly to pinned ceramic substrates.

2. Description of the Prior Art

The use of pinned ceramic substrates for electronic packaging and the like is well known to those skilled in the art, cf. U.S. Pat. Nos. 3,374,110, 3,539,876, 3,540,894, and 3,846,823, for example. Heretofore in the prior art, ceramic substrates have been pinned in a variety of ways.

For example, a prior art system known and referred to herein as a head and bulge system is commonly used to pin ceramic substrates. Essentially, a pin blank is inserted in a larger diameter preformed hole of the substrate such that it protrudes outwardly on each side of the substrate. More particularly, each of the blanks has a small uniform protrusion on one side of the substrate and a longer uniform protrusion on the opposite side of the substrate, the longer protrusions becoming the pluggable parts of the pins formed therefrom. A head is formed on the smaller protrusion of the pin blank on the one side of the substrate and a bulge is formed in the longer protrusion on the other side of the substrate, thereby forming the pin. As such, the substrate surrounding the hole and lying under the head and under the bulge becomes tightly wedged therebetween thus affixing or securing the pin to the substrate per se or in combination with the type of mechanical press fit, e.g., snug fit, frictional fit, tight fit, medium-force fit, or heavy-force fit, effected between the pin and substrate hole wall. Examples of such prior art systems are described in U.S. Pat. Nos. 3,216,097; 3,257,708; and 3,768,134.

However, because of the somewhat brittle nature of the ceramic, these prior art systems are not entirely satisfactory. More specifically, because the pin remains in its solid or plastic state during the head and bulge forming operations, the ceramic is often chipped, crushed, cracked and/or otherwise damaged by the pins during these operations. While, prior art systems such as, for example, the ones described in U.S. Pat. No. 3,735,466 and the publication entitled "Low-Stress Pin Insertion", R. J. Modlo et al, IBM Technical Disclosure Bulletin, Vol. 22, No. 8B, January 1980, pages 3649–3650, mitigate to some extent the damage to the ceramic substrates, caused by such operations they too are not entirely satisfactory because the pins still remain in a solid or plastic state during these operations and can thus cause damage to the ceramic substrate.

In certain prior art systems of the pinned ceramic substrate types, a headless pin is press fit into the hole of the substrate and an end of the pin is solder bonded to a conductive line carried on the appropriate metallized surface of the ceramic surface. A bulge may or may not be formed in the pin. The devices of U.S. Pat. Nos. 4,082,394 and 4,092,697 are examples of each of these prior art systems. However, because the pin remains in its solid or plastic state as it is being press fit into the substrate hole and/or during the bulge forming operation, it can still effect damage to the ceramic substrate.

Another prior art system is described in U.S. Pat. No. 3,736,651. In this system, the pins are provided with heads and are inverted such that the tops of the heads are solder bonded to metallic contact pads carried on an appropriate metallized surface of the ceramic substrate. As such, the pins are not located within any hole in the substrate, but are completely externally mounted to the substrate. The interconnection is thus merely limited to the solder bond between the pin head and the pad and hence is not as reliable or as mechanically stable as in the system where the pin is located in a substrate hole.

Another prior art pinned ceramic substrate system is described in the publication entitled "Pinning Technique for Ceramic Module", J. R. Lynch, IBM Technical Disclosure Bulletin, Vol. 14, No. 1, June 1971, pages 174–175. It uses a shrink-fit like principle to affix the pins thereof in the holes of a ceramic substrate. To do this, the ceramic substrate must be provided in pressed unfired, i.e. uncured, form with preformed holes. Copper pin blanks of smaller diameter are inserted into the substrate holes. The blanks extend on through the substrate holes and into correspondingly aligned holes of a graphite mold and locating fixture which supports the blank-loaded substrate and is used to cast the pins as a result of the blanks being melted in the subsequent firing cycle of the ceramic substrate.

The assembly when it is run through the ceramic firing cycle melts the copper blanks as aforementioned and cures the ceramic. After the copper solidifies, the firing shrinkage associated with the ceramic substrate causes the ceramic to shrink around the copper resulting in a pinned part which has the cast pin locked into the ceramic, but not into the graphite mold because of the different coefficients of expansion of the copper and graphite. Again, in this system because the copper is required to return to its solid or plastic state before the ceramic can effectively shrink around it, the ceramic substrate is subject to damage as it contracts around the copper. Moreover, the associated process requires precise control for processing. Because of its fabrication complexity, the aforedescribed pinned ceramic substrates are not conducive to being fabricated in a simple and reliable manner and on a mass production basis.

Moreover, the high temperatures required to cure the ceramic and melt the copper, necessitates the use of a graphite mold in the last-mentioned prior art system and hence necessitates the use of a non-consumable mold. In addition, because the ceramic undergoes substantial shrinkage as a result of being cured, whereas the mold is substantially uneffected shrinkage-wise, the recast pins were subject to being deformed because of the mismatch in the shrinkage properties of the ceramic and graphite mold.

Other prior art systems for pinning ceramic substrates using preformed pin blanks are described, for example, in U.S. Pat. No. 3,518,756.

One way to overcome the problems associated with the aforedescribed prior art systems is described in the aforementioned co-pending patent application, Ser. No. 223,190, filed Jan. 7, 1981, entitled "Pinned Substrate Apparatus", D. E. Houser, the other aforementioned co-pending application Ser. No. 223,191 describing a machine that can be used to make the pinned substrate apparatus of the aforementioned application, Ser. No. 223,190. Briefly, a pin blank is inserted into a preformed hole of a ceramic substrate. The blank is impacted with a force that temporarily places the blank in a viscoelastic fluid state. While in this temporary state, some of the pin blank part, which is in the hole, flows between the ceramic particles surrounding the hole. When the pin blank returns to it undisturbed solid state, a solid extension, which is integral with the core or main body of the pin blank, is formed from the aforedescribed pin blank flow effected between the ceramic particles and is in interlocking engaged relationship with the ceramic particles.

The present invention is another way for overcoming the aforementioned problems, as will become apparent hereinafter.

It is to be understood that it is known in the prior art to sinter dry metallic particles in previously filled via or transverse holes of a ceramic substrate and to subsequently apply preformed non-powdered metallurgy pins to the resultant formed sintered members in the vias or holes., cf. U.S. Pat. No. 3,561,110, assigned to the common assignee herein. Also it is known to use consumable molds or fixtures in the fabrication of certain electrical components. For example, the use of a meltable, vaporizable or otherwise oxidizable tube or casing containing material for making an incandescent filament is described in U.S. Pat. Nos. 349,572, 930,723, 936,403, and 1,701,342. The use of consumable molds in other electrical and in non-electrical arts is described, for example, in U.S. Pat. Nos. 786,257 and 2,412,925, and in U.S. Pat. Nos. 2,464,437, 3,049,795, and 3,201,858, respectively.

However, none of the prior art of which we are aware contemplates providing a pinned ceramic substrate in accordance with the principles of the present invention.

SUMMARY OF THE INVENTION

It is an object of this invention to provide pinned ceramic substrate apparatus which is simple and inexpensive to fabricate.

It is another object of this invention to provide ceramic substrate apparatus which is pinned in a reliable manner and reduces the risk of damaging the ceramic.

It is still another object of this invention to provide ceramic substrate apparatus which is pinned with pins of powdered metallurgy.

Still another object of this invention is to provide a method for making pinned ceramic substrate apparatus which substantially mitigates and/or minimizes damaging the ceramic during the pinning operation.

According to one aspect of the invention, there is provided pinned ceramic substrate apparatus that includes a ceramic substrate having therein plural holes. Plural powdered metallurgy pins are affixed in the holes and extend outwardly therefrom, the pins being formed in situ on the substrate.

According to another aspect of the invention, there is provided a method for making a pinned ceramic substrate having plural pins that outwardly extend from at least one predetermined surface thereof. To this end, there is provided a ceramic substrate having a plurality of first holes to be pinned. Each first hole inwardly extends from a predetermined first surface of the substrate. The first holes are filled with a powdered metallurgy. Also provided is a vaporizable carrier having a corresponding plurality of second holes inwardly extending from a predetermined second surface of the carrier. The first and second surfaces are juxtaposed in a predetermined contacting relationship with each other. Each one of the first holes is paired with a mutually exclusive one of the second holes and is in a predetermined registration relationship with the particular second hole with which it is paired when the first and second surfaces are in the aforesaid predetermined contacting relationship. The second holes are also filled with a powdered metallurgy. A first heat treatment is provided to sinter the powdered metallurgy of the first holes. A second heat treatment is also provided to sinter the powdered metallurgy of the second holes. The second heat treatment of the powdered metallurgy of the second holes occurs when the first and second respective surfaces of the substrate and the carrier are in the aforesaid predetermined contacting relationship whereby the powdered metallurgy in each of the first holes is fused to the powdered metallurgy of the particular one of the second holes paired therewith to form one of the pins affixed to the substrate and the carrier is evaporated thereby.

According to other aspects of the invention, the second heat treatment is subsequent to the first heat treatment, or alternatively the first and second heat treatments are common.

The foregoing and other objects, features and advantages of the invention will be apparent from the more particular description of the preferred embodiments of the invention, as illustrated in the accompanying drawing.

BRIEF DESCRIPTION OF THE DRAWING

FIG. 1 is a plan view of a preferred embodiment of the pinned ceramic substrate apparatus of the present invention;

FIG. 2 is a side elevation view of the apparatus of FIG.1;

FIG. 5 is a partial plan view of the pinned ceramic substrate of FIG. 4D illustrating the pins thereof in exaggerated and partially phantom outline form for purposes of explanation.

In the figures, like elements are designated with similar reference numbers.

DESCRIPTION OF THE PREFERRED EMBODIMENTS

Figure 3:
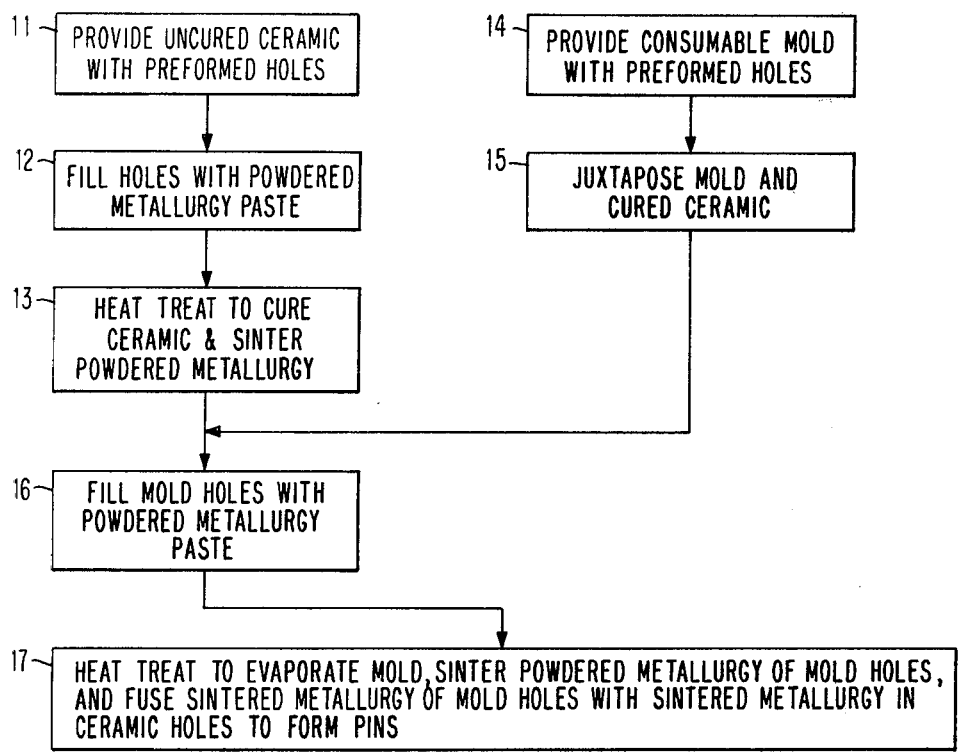
FIG. 3 is a process flow diagram of a preferred embodiment of the method of the present invention.

Referring to FIGS. 1 and 2, there is shown as idealized schematic views a preferred embodiment of the pinned ceramic substrate apparatus of the present invention. It has a ceramic substrate body 1 with plural holes 2. Plural pins 3 are affixed in the holes and extend outwardly from the substrate body 1. The pins 3 are composed of a powdered metallurgy and are formed in situ on the substrate body 1.

Preferably, the body 1 has a planar configuration, the holes 2 extend completely through the body 1 between the parallel planar surfaces 4 and 5, and the pins 3 extend outwardly from the same surface 4 and are in a predetermined spatial array. By way of example, the holes 2 are configured in a 14×14 square array, for a total of 196 holes 2, and there is a corresponding number of pins 3. Further details of the apparatus of FIGS. 1–2 and the pinning thereof will be discussed in connection with the preferred embodiment of the method of the present invention next described herein with reference to FIGS. 3–6.

Figure 4A:
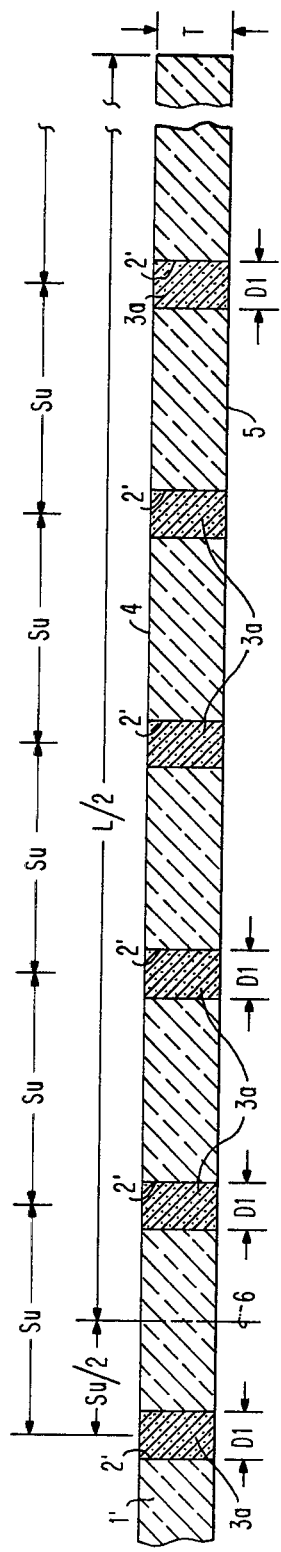
FIGS. 4A-4D are enlarged partial cross-sectional views illustrating various stages of the fabrication of a pinned ceramic substrate taken along one of the rows of holes thereof and using the method of FIG. 3.

Accordingly, in the preferred method embodiment, as designated by the reference number 11 in FIG. 3 there is provided an uncured ceramic body 1', cf. FIG. 4A, with preformed holes 2' which are to be pinned. In particular, body 1' is preferably a pressed unfired ceramic having through holes 2' arranged in a square array of substantially equally-spaced orthogonal rows and columns. The holes 2' in each row and column have a substantially uniform hole spacing Su and hole diameter D1. By way of example, the body 1' has a planar square configuration of length L and thickness T. Thus, for the given example of a square 14×14 hole array, it should be understood that each row and column has 14 holes 2' and the array is symmetrically and concentrically disposed in body 1' about its central axis which is coincidental with the central axis A of its fired form 1 shown in FIGS. 1 and 2.

Holes 2' are filled by a filling operation 12 with powdered metal particles 3a which are in a paste-like binder. For example, the paste containing the metal particles 3a, which are to be subsequently sintered, may be squeegeed into the holes 2' so as to completely fill the holes 2' and the excess removed.

With the holes 2' so filled, a heat treatment 13 is performed that cures, i.e. fires, the ceramic body 1' and sinters the metal particles in the holes 2' and evaporates the paste binder. The ceramic material used for the body 1' and the metal powder 3a are selected to have compatible shrinkage characteristics and respective firing, i.e. curing, and sintering temperatures. Particular and preferred compositions for the ceramic, and the powdered metal and the binder are hereinafter described.

Figure 4B:
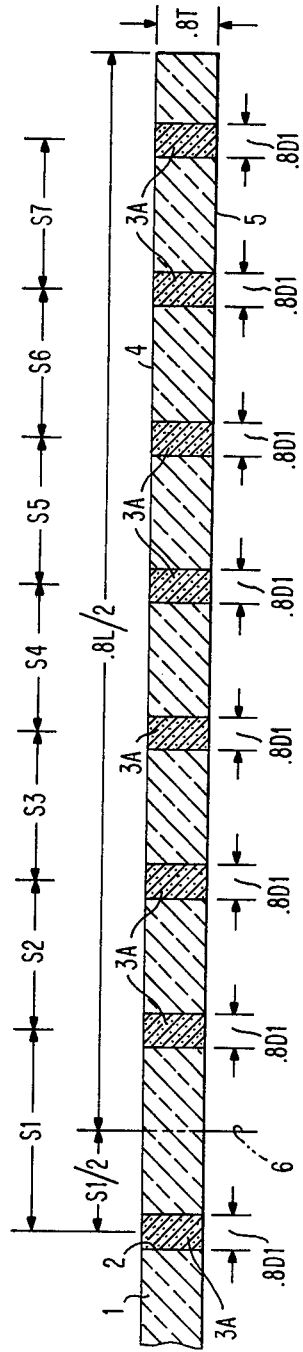

As a result of the heat treatment 13, the ceramic body 1' of FIG. 4A, the sizes of holes 2', and the powdered metal particles 3a shrink. For the aforementioned preferred ceramic composition and metal powder particles hereinafter specified the shrinkage factor is approximately 20%. Accordingly, for the 20% shrinkage factor, the overall length L and thickness T of the body 1' and hole diameter D1, as well as the corresponding parameters of the unsintered metal powder 3a, indicated in FIG. 4A are reduced to 0.8L, 0.8T and 0.8D1, respectively, as indicated in FIG. 4B. For sake of clarity, the now cured ceramic body, resultant holes, and now sintered metal powder are designated by the reference numbers 1, 2 and 3A, respectively, in FIG. 4B to distinguish them from their former respective corresponding counterparts 1', 2' and 3a of FIG. 4A.

Because, as is well known to those skilled in the art, the ceramic shrinkage is usually not linear across the body 1, the shrinkage factor is usually indicated, i.e. expressed or given, as an average. Generally, the amount of shrinkage is greater at the periphery of a ceramic body and decreases going from the outer edges towards the center of the body in a more or less random manner within certain predeterminable limits. For sake of explanation, the spacings between the adjacent holes 2 of the partially illustrated row of FIG. 4B are thus shown exaggerated therein and are assumed, by way of example, as being generally progressively smaller as they become more remote from the center 6 of the row. Thus, it should be understood that for purposes of explanation in FIG. 4B, the spacing S1 between the two center holes 2 of the row is assumed to be less than the spacing Su in FIG. 4A and has the following assumed relationship with respect to the other spacings S2, S3, etc., shown in FIG. 4B, to wit; $S1 > S2 > S3 > S4 > S5 > S6 > S7$.

Relative to the common center axis, cf. axis A, FIGS. 1–2, of the unfired body 1' and its subsequent fired form 1, the ceramic shrinkage thus causes the spatial locations of the holes 2 and consequently their contained powdered metallurgy 3A to be displaced from the originl locations of the holes 2'. Moreover, compared to the relatively larger sizes of the spacings Su, S1–S7 and the relatively smaller size D1 of the holes 2', the differences between the sizes of the holes 2 due to the ceramic shrinkage is substantially negligible and/or for sake of clarity the sizes of the holes 2 are illustrated as being substantially equal and which for the given shrinkage factor of 20% is 0.8D1, as aforementioned.

Figure 4C:
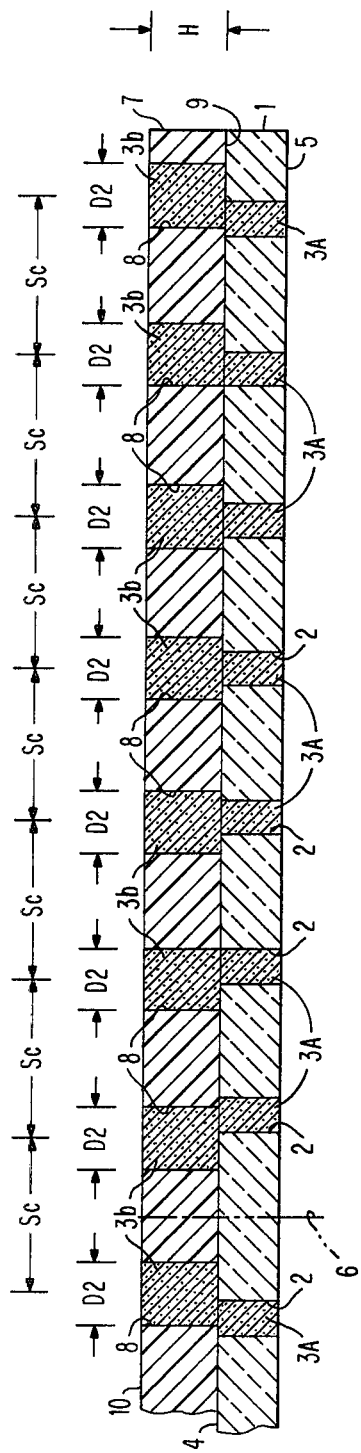

Also provided in the preferred method embodiment, as designated by the reference number 14 in FIG. 3, is a consumable vaporizable carrier 7, cf. FIG. 4C. Carrier 7 has a plurality of holes 8 that extend inwardly from its surface 9 and in the preferred method embodiment extend through to its opposite surface 10 which is planar and parallel to the planar surface 9. The number of holes 8 corresponds at least to the number of holes 2 that are to be pinned. Each one of the first holes 2 is paired with a mutually exclusive one of the second holes 8 and is in a predetermined registration relationship with the particular second hole 8 with which it is paired when the surfaces 4 and 9 of body 1 and carrier 7 are placed in the predetermined contacting relationship as hereinafter described. For sake of explanation, it is assumed that all of the 196 holes 2 of the substrate 1 are to be pinned and thus the carrier 7 is also provided with a corresponding number of holes 8. Moreover, for the given example, the holes 8 of carrier 7 are arranged in a square array in substantially equally-spaced orthogonal rows and columns with a uniform hole spacing Sc between adjacent holes 8 of the rows and columns. It should be understood that where it is desired not to pin certain of the holes 2, the appropriate holes 8 of carrier 7 need not be provided or, alternatively, if provided the appropriate holes 8 may each be blocked, for example, with individual insertable consumable plugs, not shown, which are preferably of the same composition as the carrier 7.

To compensate for the aforementioned non-uniform ceramic shrinkage of body 1, the relative diameters 0.8D1 and D2 of the substrate body holes 2 and the carrier holes 8, respectively, are judiciously selected so that when the powdered metallurgy of the holes 2 and 8 of each aforementioned pair are in their final integrally fused condition, they are in substantial overlapping alignment as will become apparent from the description of FIG. 5 hereinafter. Preferably, the diameter D2 of holes 8 is selected to be larger than the diameter 0.8D1 of holes 2 to conserve real estate on the surface 5 of body 1. This is advantageous, for example, in certain applications where a conductive metal pattern, not shown, is to be provided on surface 5 of body 1. Thus, in such cases, by selecting diameter 0.8D1 to be smaller than diameter D2, for a given conductor line width, more conductor lines of the pattern can be placed or run on surface 5 between the tops of the resultant pins 3, cf. FIG. 4D, which tops are flush with surface 5. Alternatively, diameter D2 can be selected to be the smaller of the two diameters 0.8D1 and D2 to compensate for the aforementioned non-uniform ceramic shrinkage. For example, this might be the case where the diameter size of the protruding part, cf. parts 3B, FIG. 4D, of the resultant pin and/or the spacing between such parts is more critical for other design or packaging considerations.

In the preferred method embodiment, the carrier 7 is provided with the holes 8 extending through the carrier 7 as aforementioned. This allows the carrier 7 and cured ceramic substrate body 1 to be assembled with their respective surfaces 9 and 4 in juxtaposed contacting relationship designated as operation 15 in FIG. 3 prior to a filling operation 16 of the holes 8 of the carrier 7. With the surfaces 9 and 4 of the carrier 7 and substrate body 1 in contacting relationship, the holes 2 and 8 are placed in the aforementioned paired registration relationship. If desired, this can be facilitated with the aid of suitable registration means, not shown, such as locator pins and fixtures, for example. With the substrate body 1 and carrier 7 assembled, the filling operation 16 takes place through the top surface 10 of carrier 7 thereby simplifying the procedure.

In operation 16, the holes 8 are filled with powdered metal particles 3b as shown in FIG. 4C. The particles 3b, which are disposed in a suitable paste-like binder, are, for example, squeegeed into holes 8 through surface 10, and any excess is removed. The composition of the powdered metal particles 3b and the paste are compatible with the particles 3a and paste used to fill the holes 2' and are preferably of the same composition. The particular and preferred compositions of the particles 3b and binder, as well as a preferred material for the carrier 7, are hereinafter described.

As is apparent to those skilled in the art, the sequence of operations 15 and 16 may be reversed. That is to say the holes 8 could be filled with the powder metallurgy prior to assembling the substrate body 1 and carrier 7. Moreover, if desired the holes 8 need not extend completely through the carrier 7, but may extend only partially inward from the surface 9, in which case the filling operation 16 would take place through the surface 9 and would precede the assembly operation 15.

The depth or height H of the holes 8 of carrier 7, herein sometimes referred to as a mold, is selected to compensate for the shrinkage of the powdered metallurgy 3b which fill the holes 8 so that the resultant formed pin will protrude outwardly from the surface 4 at the desired length after sintering thereof. For a 20% shrinkage factor, the resultant pins 3 will extend a length equal to 0.8H above the surface 4, cf. FIG. 4D.

Figure 4D:
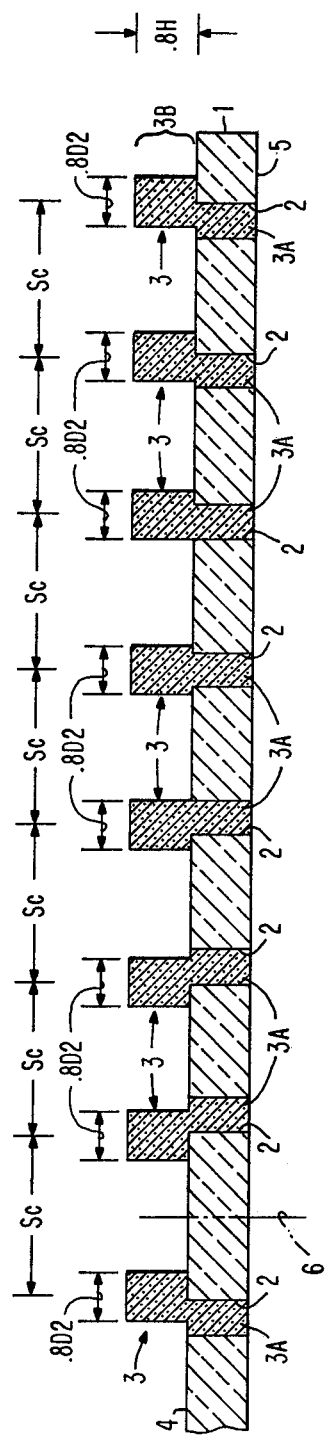

With the holes 2 and 8 filled with the powdered metallurgy and the substrate body 1 and carrier 7 assembled in the aforedescribed contacting relationship, the assembly is subjected to a heat treatment indicated by the reference number 17 in FIG. 3. The heat treatment 17 evaporates the carrier 7, sinters the metal particles 3b and evaporates the binder, and fuses the powdered metallurgy 3A in each of the holes 2 being pinned with the powdered metallurgy of its respective particular paired hole 8. As a result, the ceramic substrate body 1 is pinned with plural powdered metallurgy pins 3, each of which is a composite of the now integrally-fused two sintered powdered metallurgy parts 3A, 3B as shown in FIG. 4D. For sake of clarity, the outwardly extended sintered protrusions of the pins 3 are designated with the reference numbers 3B in FIG. 4D to distinguish them from their former respective corresponding unsintered counterparts 3b in FIG. 4C from which they are derived.

If desired, the pinned substrate 1 may be subjected to further well known finishing processes such as, for example, plating of the exposed surfaces of the pins 3 and/or the provision of the aforementioned metallizing of the surface 5 of the substrate body 1, to name just a few.

Referring now to FIG. 5, there is shown a partial plan view of the pinned ceramic substrate 1 of FIG. 4D as viewed facing the surface 4 from which the pins 3 outwardly protrude. For sake of clarity and explanation, the external portions 3B of the pins 3 are shown in FIG. 5 in phantom outline form. It is to be understood that in FIG. 5, the portions 3B are integrally fused with their respective portions 3A shown therein in solid form and the pins 3 thus being illustrated in cross-section thereat on surface 4. By way of reference, the cross-sectional view of the row of pins 3 shown in FIG. 4D is taken across the line 4D—4D shown in FIG. 5. Again, for sake of explanation, the holes 2 and consequently the internal portions 3A of pins 3 are assumed by way of example to have the non-uniform spacing configuration shown therein due to the aforedescribed non-linear shrinkage characteristic of the ceramic body 1. By judiciously selecting the hole size parameters D1 and D2, the spacings between the holes 2' of the body 1' and the spacings between the holes 8 of the carrier 7, and correlating them with the shrinkage characteristics of the ceramic and powdered metallurgy, the parts 3A, 3B of each pair are in a superimposed relationship with each other thus effecting the aforementioned overlapping alignment. Because of this, even though the parts 3A are not uniformly spaced with respect to each other, the parts 3B fused thereto have a uniform spacing Sc that is derived from the spacing Sc of the holes 8 of the carrier 7 which was consumed during the heat treatment 17.

As is obvious to those skilled in the art, alternatively, the parts 3A can be provided with the larger diameter size and the parts 3B provided with the smaller diameter size to effect the superimposed relationship and resultant overlapping alignment. Again, in this last-mentioned alternative, even though the spacing between the larger size internal parts 3A is non-uniform due to the ceramic shrinkage, the spacing Sc between the now smaller diameter size parts 3B remains uniform. This is because of the carrier 7, which though modified to have holes 8 with an appropriately correlated diameter, nevertheless is still provided with the uniform spacing Sc between the holes 8.

In the preferred method embodiment, by providing uniform spacings between the holes 2' of the unfired ceramic body 1', the fabrication of the unfired ceramic body 1' and in particular the location of the holes 2' is simplified. This is likewise the case for fabricating the carrier 7 with uniform spacings between its holes 8. However, it should be understood that in certain applications the external parts 3B of the pins need not be uniformly spaced, and in such cases the holes 8 of the carrier 7 need only be spaced to effect the aforementioned overlapping alignment of the paired parts 3A, 3B.

Still in other cases, where the ceramic shrinkage causes negligible displacements, or displacements within prescribed tolerances, between the original locations of the holes 2' and the final locations of the holes 2, the unfired ceramic body 1' with its holes 2' filled with the powdered metal paste may be assembled to the carrier 7. With the holes 8 of the latter filled with its powdered metal paste, the curing of the ceramic body 1' and the sintering of the powdered metallurgy in the holes 2' thereof, and the sintering of the powdered metallurgy of the holes 8 and the fusion of the powdered metallurgies of the paired holes, and the evaporation of the consumable carrier and the binder of the powdered metallurgies can be done with a common heat treatment.

Preferred compositions and/or materials for the apparatus and method embodiments herein are described in Table I, as follows:

TABLE I

| Ceramic | 96.0% Alumina ($Al_2O_3$) |
| --- | --- |
|  | 0.5% Magnesia (MgO) |
|  | 0.5% Calcia (CaO) |
|  | 3.0% Silicia ($SiO_2$) |
| Paste |  |
| Binder | 80% Butyl Carbitol (Registered Trademark of Union Carbide and Carbon Corp.) Acetate |
|  | 20% Ethyl Cellulose |
| Metal | Molybdenum (or alternatively Tungsten) |
| Carrier 7 | Delrin (Registered Trademark of E. I. du Pont de Nemours & Co.) |

Figure 6:
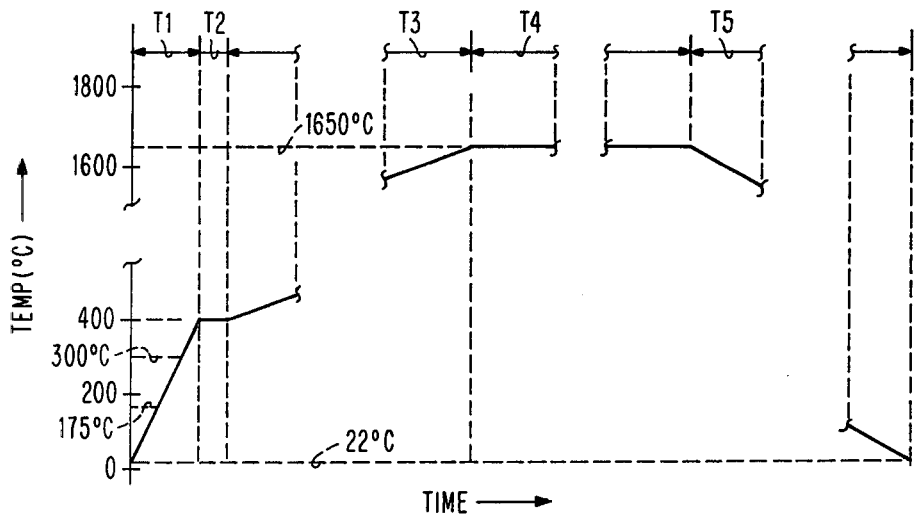
FIG. 6 is a waveform diagram of a preferred heat treatment cycle used in the method of FIG. 3.

Referring now to FIG. 6, there is shown an idealized waveform of the heat treatment cycle for the operation 17 of FIG. 3 using the compositions and materials of Table I with molybdenum as the preferred metal. During the initial phase of the cycle, the assembly of the substrate 1 and carrier 7 with their respective holes 2 and 8 containing the sintered and unsintered powdered metallurgy 3A and 3b, respectively, is placed in a suitable exhaustible furnace or oven system that is temperature regulated and has an inert atmosphere preferably of hydrogen. A temperature rise at a controlled rate of approximately from 22 degrees C. to 400 degrees C. is effected during the initial time period T1 of the cycle which is sufficient to melt and vaporize the carrier 7. Delrin has a melting point of approximately 175 degrees C. and turns into a gas at about 300 degrees C., and completely decomposes before 400 degrees C. Because Delrin has a generic composition of acetal formaldehyde resin, it has no substantial toxic or adverse by-products. To insure, inter alia, complete removal of the carrier 7 and its by-products, an additional time period T2 is provided.

A temperature rise at a controlled rate is next effected to place the metallurgy 3b at its sintering temperature. Thus, during the time period T3, the temperature rises from 400 degrees C. to 1650 degrees C., which is the sintering temperature of the molybdenum particles 3b. The cycle remains at the sintering temperature for a sufficient time period T4 and thereafter returns at a controlled rate to room temperature, i.e. 22 degrees C. approximately, during the time period T5. Preferred times for the time periods T1–T5, are as follows, to wit; T1=10 mins., T2=4 mins., T3=6 hrs., T4=2 hrs., and T5=6 hrs.

During the time period T1, the binder of the metallurgical paste evaporates, its melting temperature being higher than 250 degrees C. When the carrier 7 melts and turns to gas and the binder evaporates, the metallurgy 3b substantially retains the shape of the carrier's holes 8 due to the now dried-up paste-like consistency of the metallurgy 3b. As the cycle continues, the metallurgy 3b retains this shape except for the aforedescribed shrinkage it undergoes during sintering. During the period T4, the metal particles 3b become sintered, shrink and fuse to the metallurgy 3A. Thus, the composite pins 3, are each comprised of two fused integral sintered parts 3A and 3B, and formed in situ on the substrate body 1 with the desired shapes and at the desired locations at the end of the cooling-off period T5.

In addition to the alternatives, changes and/or modifications heretofore described, other alternatives, changes and/or modifications to the apparatus and method of the present invention are possible as is apparent to those skilled in the art. Thus, for example, while the invention has been described with planar rectangular members 1' or 1 and 7 having respective cylindrical-shaped holes 2' or 2 and 8 and pins 3 as a consequence resulting with cylindrical-shaped parts 3A, 3B in offset vertical alignment, the invention may be modified to provide other shapes and sizes for the ceramic body 1 and its holes 2,2', as well as for the carrier 7 and its holes 8, and shapes and sizes of the pins 3 and/or the components 3A, 3B thereof. Moreover, the holes 2', 2 may only partially extend into the ceramic body 1', 1. Also, the pins 3 may protrude outwardly from both surfaces 4 and 5 of the ceramic body 1, and or from other non-parallel surfaces of a ceramic body having other symmetrical or non-symmetrical shapes, such as cylindrical, L-shaped, cube, etc. to name just a few. Moreover, while the pins 3 are particularly useful for pluggable substrate type applications for insertion into a suitable receptical such as , for example, a printed circuit board or the like, the pins 3 may also be used in other applications where the pins 3, for example, are merely bonded by solder or the like to the surface pads or lands of a printed circuit board in a stand-off manner. In addition, while it is preferred to have the ceramic body 1' cured and the powdered metallurgy in the holes thereof sintered with a common heat treatment, the ceramic body 1' may be cured prior to the filling of the holes thereof with the powdered metallurgy and the sintering of the latter. Also, while the ceramic body 1' with its holes 2' are preferably fabricated using known pressed techniques, it may also be fabricated using other well known techniques such as, for example, casting, injection molding, tape processing, etc., to name just a few. Likewise, other cycle parameters may be employed and/or other compatible ceramic compositions and powdered metal compositions and/or carrier materials in lieu of those described with respect to FIG. 6 and Table I, respectively.

Thus, while the invention has been described with reference to preferred embodiments thereof, it will be understood by those skilled in the art that various changes in form and details may be made without departing from the scope of the invention.

We claim:

1. A method for making a pinned ceramic substrate having plural pins outwardly extending from at least one predetermined surface thereof, said method comprising the steps of:

providing a ceramic substrate having a plurality of first holes to be pinned, said first holes inwardly extending from a predetermined first surface of said substrate, filling said first holes with unsintered powdered metal particles in a temporary non-elastomer paste-like binder, providing a vaporizable carrier having a corresponding plurality of second holes inwardly extending from a predetermined second surface thereof, juxtaposing said first and second surfaces in a predetermined contacting relationship with each other, each one of said first holes being paired with a mutually exclusive one of said second holes and being in a predetermined registration relationship therewith when said first and second surfaces are in said predetermined contacting relationship, filling said second holes with unsintered powdered metal particles in a temporary non-elastomer paste-like binder, and providing a heat treatment to sinter said unsintered powdered metal particles of said first and second holes and to evaporate away said binder thereof, whereby said powdered metal particles in each one of said paired first and second holes is fused to form one of said pins affixed to said substrate and said carrier is evaporated away by said heat treatment, said binders and said carrier being evaporated away within the temperature range of 250 to 400 degrees C., and said powdered metal particles being sintered at a temperature greater than 400 degrees C., and said ceramic substrate and said powdered metal particles having compatible shrinkage characteristics, and said ceramic substrate and said powdered metal particles having compatible firing and sintering temperatures, respectively.

2. The method according to claim 1 wherein said ceramic substrate is uncured, said ceramic substrate being cured during said heat treatment.

3. A method for making a pinned ceramic substrate having plural pins outwardly extending from at least one predetermined surface thereof, said method comprising the steps of:

providing a ceramic substrate having a plurality of first holes to be pinned, said first holes inwardly extending from a predetermined first surface of said substrate, filling said first holes with unsintered powdered metal particles in a temporary non-elastomer paste-like binder, providing a first heat treatment to sinter said unsintered powdered metal particles of said first holes and to evaporate said binder thereof, providing a vaporizable carrier having a corresponding plurality of second holes inwardly extending from a predetermined second surface thereof, juxtaposing said first and second surfaces in a predetermined contacting relationship with each other, each one of said first holes being paired with a mutually exclusive one of said second holes and being in a predetermined registration relationship therewith when said first and second surfaces are in said predetermined contacting relationship, filling said second holes with unsintered powdered metal particles in a temporary non-elastomer paste-like binder, and providing a second heat treatment to sinter said unsintered powdered metal particles of said second holes and to evaporate said binder thereof, whereby said powdered metal particles in each one of said paired first and second holes is fused to form one of said pins affixed to said substrate and said carrier is evaporated away by said second heat treatment, said binders and said carrier being evaporated away within the temperature range of 250 to 400 degrees C., and said powdered metal particles being sintered at a temperature greater than 400 degrees C., and said ceramic substrate and said powdered metal particles having compatible shrinkage characteristics, and said ceramic substrate and said powdered metal particles having compatible firing and sintering temperatures, respectively.

4. The method according to claim 3 wherein said ceramic substrate is uncured, said ceramic substrate being cured during said first heat treatment.

5. The method according to claim 3 wherein said mold is an acetal composition.

6. The method according to claim 1 or 3 wherein said binder is a composition of diethylene glycol butyl ether and ethyl cellulose.

7. The method according to claim 1 or 3 wherein said ceramic has a composition comprising 96.0% $Al_2O_3$, 0.5% MgO, 0.5% CaO, and 3.0% $SiO_2$, and wherein said powdered metal particles are from the group consisting of molybdenum and tungsten.

* * * * *